United States Patent
Haukness et al.

(10) Patent No.: US 11,238,930 B2
(45) Date of Patent: Feb. 1, 2022

(54) METHOD OF RRAM WRITE RAMPING VOLTAGE IN INTERVALS

(71) Applicant: Hefei Reliance Memory Limited, Hefei (CN)

(72) Inventors: Brent Haukness, Monte Sereno, CA (US); Zhichao Lu, San Jose, CA (US)

(73) Assignee: Hefei Reliance Memory Limited, Hefei (CN)

( * ) Notice: Subject to any disclaimer, the term of this patent is extended or adjusted under 35 U.S.C. 154(b) by 0 days.

(21) Appl. No.: 16/984,043

(22) Filed: Aug. 3, 2020

(65) Prior Publication Data

US 2021/0012838 A1    Jan. 14, 2021

Related U.S. Application Data

(62) Division of application No. 16/462,721, filed as application No. PCT/US2017/067349 on Dec. 19, 2017, now Pat. No. 10,998,044.

(60) Provisional application No. 62/448,831, filed on Jan. 20, 2017.

(51) Int. Cl.
    *G11C 13/00* (2006.01)
(52) U.S. Cl.
    CPC ........ *G11C 13/0069* (2013.01); *G11C 13/003* (2013.01); *G11C 13/0026* (2013.01); *G11C 13/0028* (2013.01); *G11C 2013/0078* (2013.01); *G11C 2013/0092* (2013.01); *G11C 2213/82* (2013.01)
(58) Field of Classification Search
    CPC ............ G11C 13/0069; G11C 13/0026; G11C 13/0028; G11C 13/003; G11C 2013/0078; G11C 2013/0092; G11C 2213/82; G11C 2013/0083; G11C 13/0002
    See application file for complete search history.

(56) References Cited

U.S. PATENT DOCUMENTS 7,457,146 B2  11/2008  Phillipp et al.
8,094,481 B2   1/2012  Katoh et al.
8,885,387 B2  11/2014  Azuma et al.
(Continued)

FOREIGN PATENT DOCUMENTS

JP    2008-59736 A    3/2008
JP    2012-146368 A   8/2012
(Continued)

OTHER PUBLICATIONS

PCT International Search Report and the Written Opinion dated Mar. 8, 2018, issued in related International No. PCT/US2017/067349 (11 pages).
(Continued)

*Primary Examiner* — Jerome Leboeuf
(74) *Attorney, Agent, or Firm* — Sheppard Mullin Richter & Hampton LLP

(57) ABSTRACT

Disclosed is a resistive random access memory (RRAM) circuit and related method to limit current, or ramp voltage, applied to a source line or bitline of an RRAM array. The RRAM array has one or more source lines and one or more bitlines. A control circuit sets an RRAM cell to a low resistance state in a set operation, and resets the RRAM cell to a high resistance state in a reset operation. A voltage applied to a bitline or source line is ramped during a first time interval, held to a maximum voltage value during a second interval, and ceased after the second time interval.

17 Claims, 7 Drawing Sheets

1402 — Ramp voltage to bitline or source line, during first time interval

1404 — Hold bitline or source line at maximum voltage, during second time interval 1406 — Cease applying voltage to bitline or source line

(56) References Cited

U.S. PATENT DOCUMENTS

| | | |
|---|---|---|
| 8,917,535 B2 | 12/2014 | Lee et al. |
| 9,019,755 B2 | 4/2015 | Otsuka |
| 9,165,644 B2 | 10/2015 | Kamalanathan et al. |
| 9,336,881 B2 | 5/2016 | Shimakawa et al. |
| 9,691,478 B1 | 6/2017 | Lin et al. |
| 2007/0070682 A1 | 3/2007 | Nakashima et al. |
| 2009/0073754 A1 | 3/2009 | Bae et al. |
| 2012/0182785 A1 | 7/2012 | Otsuka |
| 2013/0215669 A1 | 8/2013 | Haukness |
| 2013/0235651 A1 | 9/2013 | Perner et al. |
| 2014/0376304 A1 | 12/2014 | Haukness |
| 2015/0070965 A1 | 3/2015 | Bandyopadhyay et al. |
| 2016/0035419 A1 | 2/2016 | Zaitsu et al. |
| 2016/0148685 A1 | 5/2016 | Roy et al. |
| 2017/0140819 A1 | 5/2017 | Lee et al. |
| 2017/0221562 A1 | 8/2017 | Buchanan |
| 2018/0102171 A1 | 4/2018 | Lee et al. |

FOREIGN PATENT DOCUMENTS

| | | |
|---|---|---|
| JP | 2016-21272 A | 2/2016 |
| WO | 2008/129774 A | 10/2008 |
| WO | 2015/085093 A1 | 6/2015 |

OTHER PUBLICATIONS

PCT International Preliminary Reporton Patentability dated Aug. 1, 2019, issued in related International No. PCT/US2017/067349 (9 pages).

Notice of Reasons for Rejection dated Sep. 29, 2020, issued in related Japanese Application No. 2019-559262, with English translation (8 pages).

Non-Final Office Action dated Oct. 9, 2020, issued in related U.S. Appl. No. 16/462,721 (19 pages).

Notice of Allowance dated Jan. 4, 2021, issued in related U.S. Appl. No. 16/462,721 (9 pages).

METHOD OF RRAM WRITE RAMPING VOLTAGE IN INTERVALS

REFERENCE TO RELATED APPLICATION

The present application is a divisional application of U.S. patent application Ser. No. 16/462,721, filed on May 21, 2019, titled "RRAM WRITE", which is a national stage application under 35 U.S.C. § 371 of PCT Application No. PCT/US2017/067349, filed on Dec. 19, 2017, which is based on and claims benefit of priority to U.S. Provisional Patent Application No. 62/448,831, filed on Jan. 20, 2017, titled "Current Controlled Reset Operation for RRAJVI and Ramped Bitline for RRAM set". The above-referenced applications are incorporated by reference in their entirety.

BACKGROUND

Non-volatile memory is a type of memory device that can store information even after loss of power. Non-volatile memory (NVM) devices can be read only memory or random access memory (RAM) and may use various technologies. One category of non-volatile RAM is resistive RAM, including technologies such as filamentary resistive random access memory (RRAM or ReRAM) cells, interfacial RRAM cells, magnetoresistive RAM (MRAM) cells, phase change memory (PCM) cells (e.g., chalcogenides including alloys of germanium, antimony, and tellurium), memristor memory elements, and programmable metallization cells (e.g., conductive bridging RAM (CBRAM) cell). The RRAM cell is a promising non-volatile memory device for embedded and standalone applications due to its fast operation time and low power performance. There is an ongoing need to improve long-term reliability with repeated set and reset cycles of RRAM cells.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
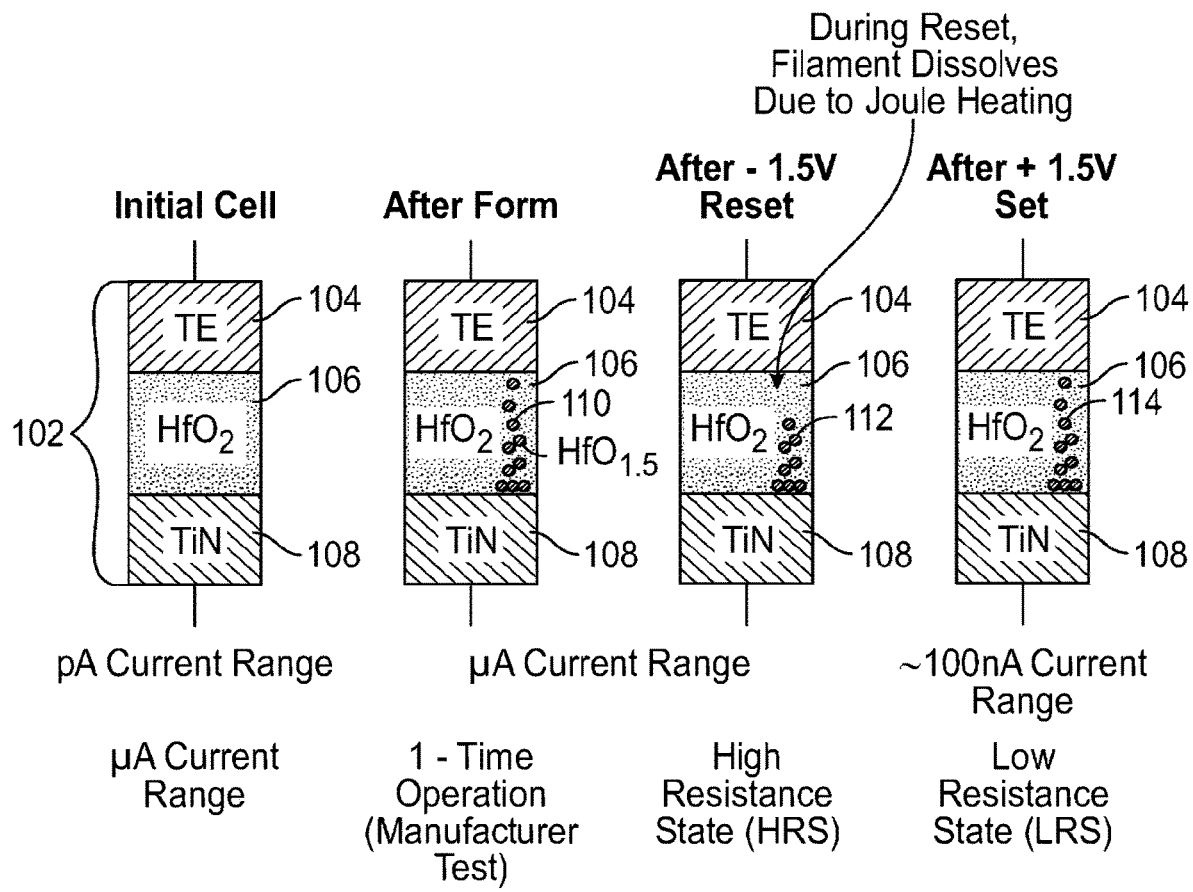
FIG. 1 illustrates a filament structure of an RRAM cell, and formation of the high resistance state (HRS) and the low resistance state (LRS) of the RRAM cell, according to an embodiment.

In the following description, various aspects of the illustrative embodiments will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative embodiments. However, it will be apparent to one skilled in the art that the present disclosure may be practiced without the specific details. In other instances, well-known features are omitted or simplified in order not to obscure the illustrative embodiments. Although various embodiments described herein are described with respect to RRAM cells, in other embodiments, these technologies can be used in other filamentary RAM technologies, including, for example, CBRAM cells, interfacial RRAM cells, MRAM cells, PCM cells, or other programmable metallization cells.

Resistive random-access memory (RRAM) is a type of non-volatile random-access memory. An RRAM structure includes a bottom electrode that is formed of a conductive material. The RRAM structure further includes a switchable layer disposed above the bottom electrode. When a voltage is applied to the switchable layer, one or more oxygen vacancies (e.g., switchable filaments) may be formed in the switchable layer. The oxygen vacancies may provide a conductive path across the switchable layer. Therefore, the switchable layer may be in a low resistance state when oxygen vacancies are formed. Conversely, the switchable layer may be in a high resistance state when the oxygen vacancies are broken (e.g., reset). A resistive layer may be disposed above the switchable layer.

Memory cells of the RRAM structure (also referred to as "RRAM cells" hereafter) may be formed at an intersection of a bitline and a word line or above vias of a semiconductor device. The RRAM cells may be formed using an etching or plasma process. A masking material may be applied to a portion of the upper surface of the resistive layer that resists an etching chemical or plasma. The switching layer and resistive layer may be exposed to the etching chemical or plasma to form the RRAM cells. Following the etching or plasma process, a top electrode layer may be disposed above the resistive layer and a masking material may be applied to a portion of the upper surface of the top electrode layer. Then a second etching or plasma process may be performed on the top electrode layer to form top electrodes (e.g., bitlines) of the RRAM structure. In order to form the individual RRAM cells of the RRAM structure, multiple masking operations may be performed, increasing the cost to produce and manufacture the RRAM structure as well as the complexity of the manufacturing process. Furthermore, the etching or plasma process may leave extra material around the RRAM cells, causing cell edge effects that decrease RRAM cell performance and uniformity.

Transition Metal Oxide (TMO) RRAM cells work by applying a voltage across the device to form an oxygen vacancy filament to set the cell in a low resistance state (LRS). To reset the cell to a high resistance state (HRS), an opposite polarity voltage is applied across the cell which breaks the oxygen vacancy filament. The filament is believed to dissolve during the reset operation due to thermal heating from the power dissipated in the filament resistance. It is desirable to precisely control the power dissipated during the reset operation such that power is above some threshold minimum value, but below values which may cause damage to the cell, affecting other device characteristics. It is further desirable to precisely control the power dissipated during the set operation, to avoid damage to the cell. It is still further desirable to precisely control power during set and reset operations, for more uniform distribution of resistivity in the high resistance state and low resistance state of the resistive filament, across the RRAM cells of the RRAM array and through multiple cycles of set and reset, and thereby improve read reliability.

One way to limit this power is to control the current through the RRAM cell during the reset to the high resistance state and/or during the set to the low resistance state. In a conventional reset operation, the voltage Vwrite is applied directly to the source line (SL) of the RRAM array with the bitline (BL) at Vss and the access transistor at Vdd. The cell current is a function of the cell resistance (V/R) as well as the power (IV or $V^2/R$), and the power is only limited due to the current capability of the cell access transistor, in typical RRAM array circuits. Various embodiments of RRAM array circuits shown herein control this power more precisely.

In some embodiments, a control circuit limits current through the RRAM cell to the value set by current limit Ilim (for example, 100 uA or 150 Ua). This results in the maximum power being controlled by this current limit and not merely by the other transistor characteristics of the circuit. This current limit can be set precisely and is adjustable to optimize cell performance. In some embodiments current limit is programmable, for example with configuration registers, fuses, etc. In some embodiments, current limit value is set as a function of the set resistance of the cell (or read current prior to reset operation). The current limit may be changed as a function of device parameters, e.g., number of cycles, temperature, etc. The current reference and/or mirror circuits may be shared for set current limiting and/or reset current limiting.

FIG. 1 illustrates a filament structure of an RRAM cell, and formation of the high resistance state and the low resistance state of the RRAM cell. Although the RRAM cell is shown with specific materials, this should be considered only an example and not limiting for the type of RRAM cell to which present embodiments of control circuits and methods apply. In the initial RRAM cell 102 of FIG. 1, there is no filament in the filament forming region 106 between the two electrodes 104, 108. The upper electrode 104 is made of tellurium or Te, the lower electrode 108 is made of titanium nitride or TiN, and the filament forming region is made of hafnium oxide, also known as hafnia or $HfO_2$. After formation, the resistive filament 110 is found resistively connecting the two electrodes 104, 108, and is made of a fractional composition of hafnia, $HfO_{1.5}$. After a nominal −1.5 V reset (or other reset voltage in further embodiments), the resistive filament 112 is partially (or fully) dissolved, due to Joule heating (also called resistive heating and ohmic heating), and the RRAM cell is in the high resistance state or HRS. After a nominal 1.5 Vset (or other set voltage in further embodiments), the resistive filament 114 is formed or reformed between the two electrodes 104, 108, and the RRAM cell is in the low resistance state or LRS. Controlling power, by controlling current and/or voltage during the set and/or the reset operation may limit damage and may contribute to more uniform formation or dissolution of the resistive filament 110, 112, 114 in the RRAM cell. Further, controlling surge of power may limit damage.

Figure 2:
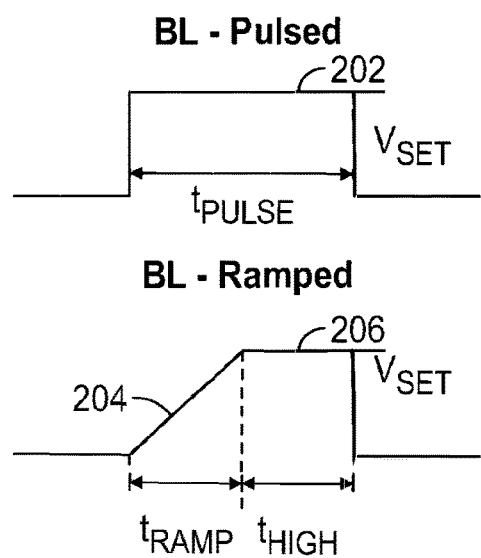
FIG. 2 illustrates the difference between pulsing a bitline and ramping a bitline, to a set voltage $V_{SET}$ for an RRAM cell, according to an embodiment.

FIG. 2 illustrates the difference between pulsing a bitline and ramping a bitline, to a set voltage $V_{SET}$ for an RRAM cell, according to an embodiment. A pulsed waveform 202 for a bitline to a selected RRAM cell has a specified pulse width or pulse time $t_{PULSE}$, and a specified set voltage $V_{SET}$. In contrast, a ramped waveform 204, 206 for a bitline to a selected RRAM cell has a specified ramp time $t_{RAMP}$, during which the ramp portion 204 of the waveform ramps up to the set voltage $V_{SET}$, and a specified high time $t_{HIGH}$ at the specified set voltage $V_{SET}$, during which the level portion 206 of the waveform holds at a steady voltage and does not ramp up or down. The ramp time of the ramp portion 204 and high time of the level portion 206 of the waveform add up to the pulse width or pulse time. A similar pair of waveforms can be envisioned for ramping up a source line for reset of the RRAM cell. In some embodiments, the ramped waveform 204, 206 is achieved through voltage control, and in other embodiments through current control.

A real-world pulse is really non-ideal, i.e., not a mathematically perfect rectangle waveform, and when viewed at certain scales (e.g., zoomed in on the rise to a scale that is much smaller than the signal time) the pulse might look like a ramped waveform. That is, at some scale, all real-world pulses have a nonzero rise time. However, in context with the time of the application of the signal, the leading edge in a pulse is an insignificant duration and can be omitted from consideration. In contrast, during a ramped signal in accordance with embodiments described herein, the time of the rise for the ramp is significant with respect to the application of the signal, and is intended and controlled. In some embodiments, a signal where the rise takes up 5% or more of the signal application is considered a ramp for short pulses.

Figure 3:
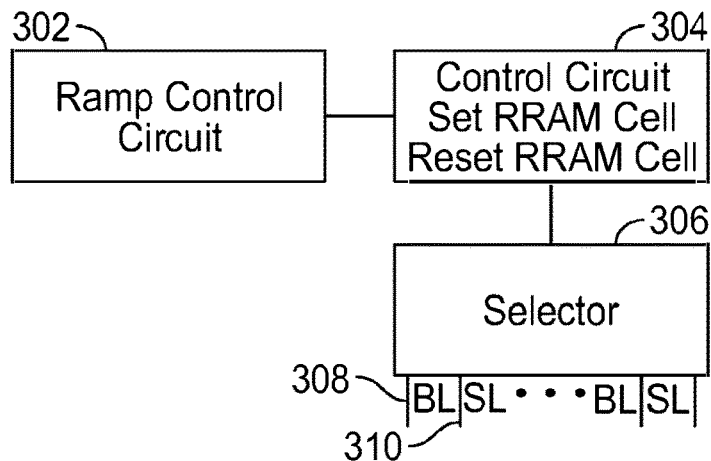
FIG. 3 illustrates an embodiment of a control circuit with a ramp control circuit, for controlling voltage of a bitline and/or a source line during set and/or reset operations for an RRAM cell.

FIG. 3 illustrates an embodiment of a control circuit 304 with a ramp control circuit 302, for controlling voltage of a bitline 308 and/or a source line 310 during set and/or reset operations for an RRAM cell. The ramp control circuit 302 could use voltage control or current control to ramp up a set voltage for a set operation for the RRAM cell, or ramp up a reset voltage for a reset operation for the RRAM cell. A selector 306 selects a bitline 308 and a source line 310 for the RRAM cell, according to address lines (not shown).

Figure 4:
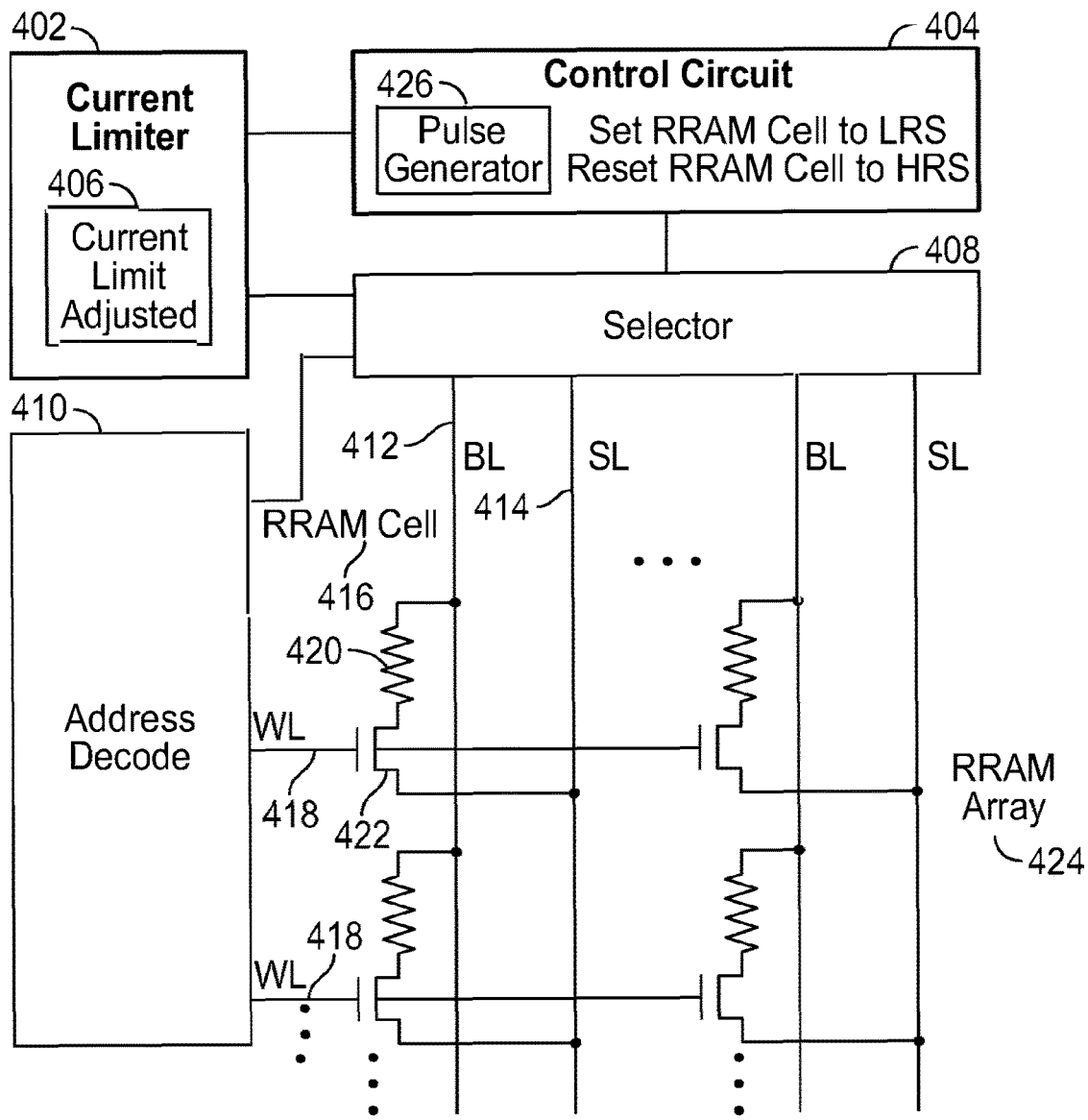
FIG. 4 illustrates an embodiment of a control circuit with a current limiter for controlling current in an RRAM cell during set and/or reset operations.

FIG. 4 illustrates an embodiment of a control circuit 404 with a current limiter 402 for controlling current in an RRAM cell during set and/or reset operations. To select a specific RRAM cell 416 and resistor 420 of the RRAM cell 416 (e.g., resistive filament 110, 112, 114 of FIG. 1), a word line 418 connected to gate terminals of a row of access transistors 422 in RRAM cells 416 is activated by the address decode 410, and the bitline (BL) 412 and source line (SL) 414 of a column in the RRAM array 424 are controlled by the selector 408. A set operation is performed by asserting the selected word line 418 through address decode 410, grounding the selected source line 414 through the selector 408, and applying a set pulse to the bitline 412 through the selector 408, to set the RRAM cell 416 to the low resistance state. A reset operation is performed by asserting the selected word line 418 through address decode 410, grounding the selected bitline 412 through the selector 408, and applying a reset pulse to the source line 414 through the selector 408, to reset the RRAM cell 416 to the high resistance state. In this embodiment, the current limiter 402 controls current during the set pulse, and/or controls current during the reset pulse. In some versions, there is a current limit adjuster 406 that adjusts the current limit applied by the current limiter 402. In some versions, a current limit applied to the source line 414 is lower than a current limit applied to the bitline 412, because of differences in the amount of current and power needed for set operations and reset operations.

Figure 5:
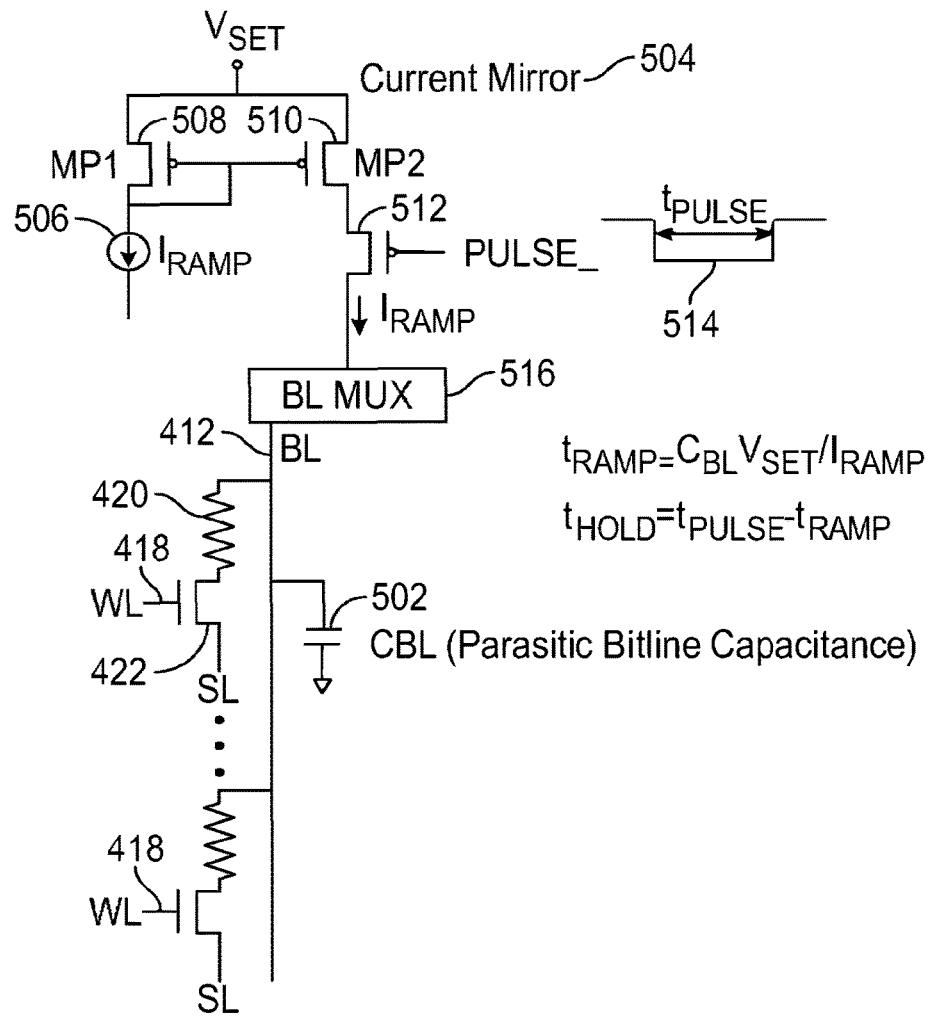
FIG. 5 illustrates an embodiment of a control circuit with a current mirror for controlling ramp current $I_{RAMP}$ to an RRAM cell during a set operation.

FIG. 5 illustrates an embodiment of a control circuit with a current mirror 504 for controlling ramp current $I_{RAMP}$ to an RRAM cell during a set operation. A current source 506 (or current sink) pulls current through diode connected MOSFET 508 labeled MP1, and this current is mirrored through a gate-connected mirroring transistor 510, labeled MP2. The mirrored current is delivered through a set pulse 514 switch-operated transistor 512 to the bitline multiplexer 516, the selected bitline 412, and the resistor 420 of the selected RRAM cell 416. Because there is a parasitic bitline capacitance ($C_{BL}$) 502, the controlled current charges up the bitline 412 to the set voltage $V_{SET}$ during a ramp time according to the formula $t_{RAMP}=C_{BL} V_{SET}/I_{RAMP}$. Hold time is according to the formula $t_{HOLD}=t_{PULSE}-t_{RAMP}$, where $t_{PULSE}$ is the pulse width of the set pulse 514. Application of controlled current with a maximum voltage to the bitline 412 thus forms the bitline ramped waveform 204, 206 seen in the lower part of FIG. 2.

Figure 6:
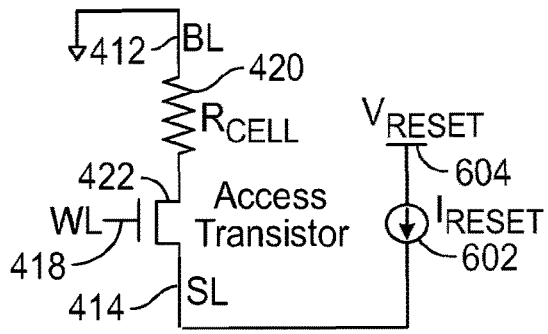
FIG. 6 illustrates an embodiment of a circuit for controlling reset current $I_{RESET}$ in a source line for an RRAM cell.

FIG. 6 illustrates an embodiment of a circuit for controlling reset current $I_{RESET}$ in a source line 414 for an RRAM cell. A controlled current source 602, from a maximum reset voltage $V_{RESET}$ 604, is applied to the source line 414 and through the access transistor 422, activated by the word line 418, to the resistor 420 (i.e., resistive filament) of the RRAM cell. The selected bitline 412 is grounded (or otherwise held at a defined voltage). Various types of circuitry configurations may be used to achieve this behavior.

Figure 7:
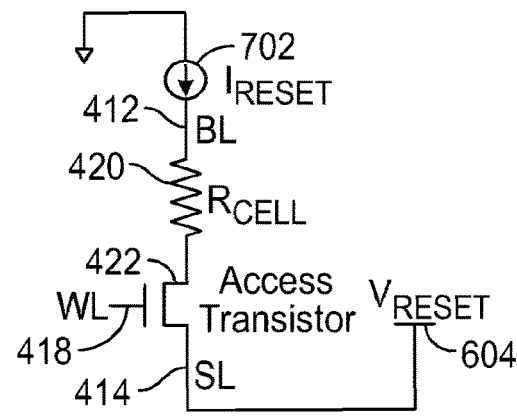
FIG. 7 illustrates an embodiment of a circuit for controlling reset current $I_{RESET}$ in a bitline for an RRAM cell.

FIG. 7 illustrates an embodiment of a circuit for controlling reset current $I_{RESET}$ in a bitline for an RRAM cell. In this version, the reset voltage $V_{RESET}$ is applied to the source line 414. The controlled current source 702 pulls the reset current $I_{RESET}$ out through the bitline 412, from the resistor 420 of the RRAM cell, the access transistor 422 activated by the word line 418, and the source line 414. Various types of circuitry configurations may be used to achieve this behavior.

Figure 8:
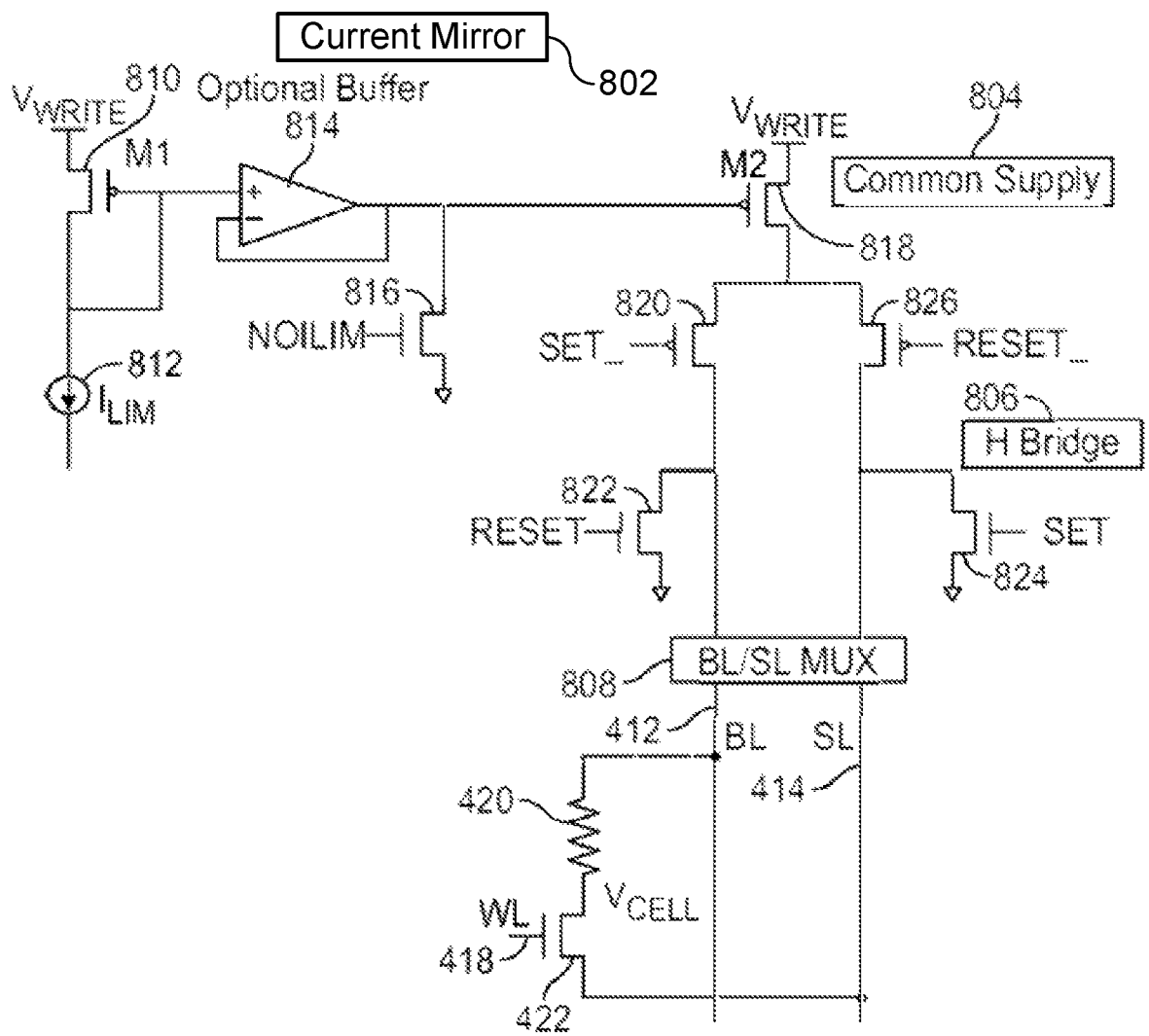
FIG. 8 illustrates an embodiment of a circuit with a current mirror and a common supply, for controlling current in a source line for a reset operation and a bitline for a set operation.

FIG. 8 illustrates an embodiment of a circuit with a current mirror 802 and a common supply 804, for controlling current in a source line 414 for a reset operation and a bitline 412 for a set operation. A current source (or sink) pulls a limit current $I_{LIM}$ out from a diode-connected MOSFET 810 labeled M1. In some versions, a unity gain buffer 814, shown as an op amp with output fed back to the negative input, buffers the gate voltage of MOSFET 810 and connects to the gate of the MOSFET 818 labeled M2, to form the common supply 804. Current from the common supply, which mirrors the limit current, is switched through an H bridge 806 to a bitline 412 or a source line 414, the other of which is grounded. For a set operation, the lower right arm transistor 824 of the H bridge 806 is turned on, grounding the source line, while the upper left arm transistor 820 of the H bridge 806 is turned on, supplying the limit current to the bitline 412 through the bitline/source line multiplexer (BL/SL MUX) 808. For a reset operation, the lower left arm transistor 822 of the H bridge 806 is turned on, grounding the bitline 412, while the upper right arm transistor 826 of the H bridge 806 is turned on, supplying the limit current to the source line 414 through the bitline/source line multiplexer 808. Limited current, with capacitance of the bitline or source line, produces a ramped waveform such as shown in the lower part of FIG. 2. The pulsed, non-ramped waveform shown in the upper part of FIG. 2 can be produced by activating the no limit signal and turning on the grounding transistor 816, may defeating the current mirror 802 and fully activating the common supply 804, in some embodiments.

Figure 9A:
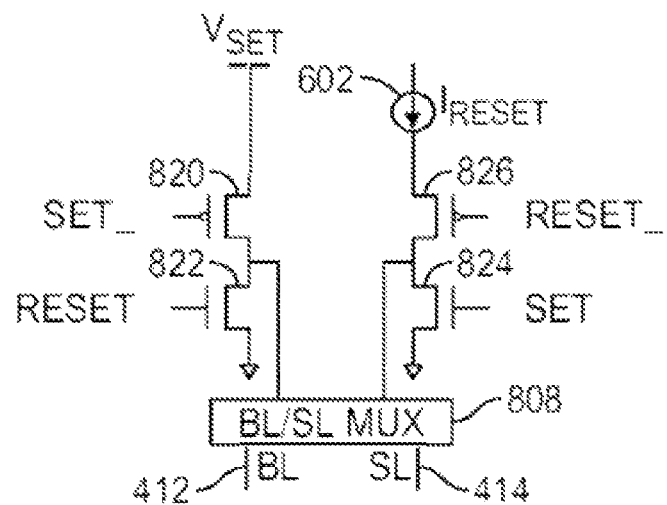
FIG. 9A illustrates an embodiment of a circuit for controlling reset current $I_{RESET}$ in a selected source line.
Figure 9B:
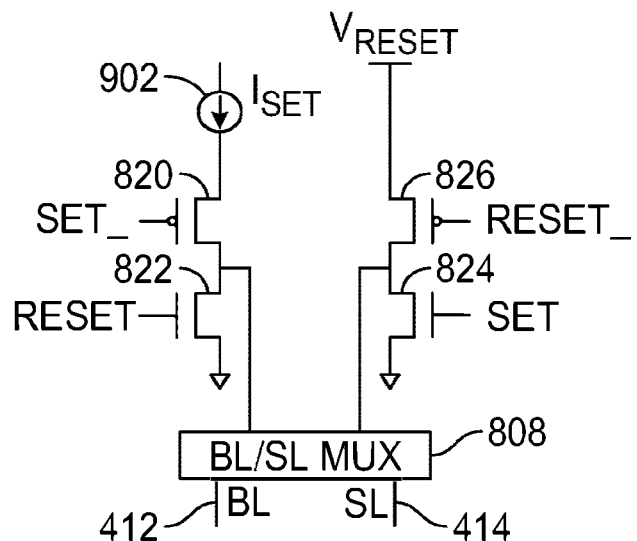
FIG. 9B illustrates an embodiment of a circuit for controlling set current $I_{SET}$ in a selected bitline.
Figure 9C:
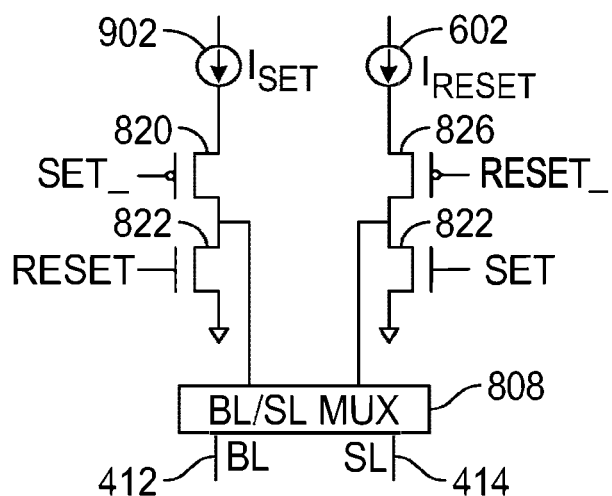
FIG. 9C illustrates an embodiment of a circuit for controlling set current $I_{SET}$ in a selected bitline and reset current $I_{RESET}$ in a selected source line.

Variations of the circuit of FIG. 8 can be built without the common supply 804, as shown in FIGS. 9A-9C, to more directly couple a voltage supply and/or a current supply to upper or outer terminals of an H bridge 806. Some versions limit current for set operations, some versions limit current for reset operations, and some versions limit current for both. In some embodiments, the reset circuitry may be located in a different place than the set circuitry. For example, the reset current control could be on the bottom of the array while the set circuitry is on the top of the array, or vice versa. In some embodiments, the source line could have a different orientation than shown in the drawings, for example the source line may run horizontally through the array, parallel to the word line. Current may still be limited for a reset, with circuitry on either the left or right side of the array. Similar and further variations for layout and orientation of source lines, word lines, bit lines, switches, current controls, multiplexing, etc., apply to further variations for the RRAM array.

FIG. 9A illustrates an embodiment of a circuit for controlling reset current $I_{RESET}$ in a selected source line. A current source 602 limited to reset current $I_{RESET}$ is connected to the upper right arm transistor 826 of the H bridge 806. A set voltage source for $V_{SET}$ is connected to the upper left arm transistor 820 of the H bridge 806. Operation of the transistors 820, 822, 824, 826 of the H bridge 806 is similar to that depicted in FIG. 8. Controlled, limited reset current $I_{RESET}$ is switched to the selected source line 414 during an RRAM cell reset operation, while the bitline is grounded. This circuit could implement a variation of the circuit shown in FIG. 6.

FIG. 9B illustrates an embodiment of a circuit for controlling set current $I_{SET}$ in a selected bitline. A current source 902 limited to set current $I_{SET}$ is connected to the upper left arm transistor 820 of the H bridge 806. A reset voltage source for $V_{RESET}$ is connected to the upper right arm transistor 826 of the H bridge 806. Operation of the transistors 820, 822, 824, 826 of the H bridge 806 is similar to that depicted in FIG. 8. Controlled, limited set current $I_{SET}$ is switched to the selected bitline 412 during an RRAM cell set operation, while the source line is grounded.

FIG. 9C illustrates an embodiment of a circuit for controlling set current $I_{SET}$ in a selected bitline and reset current $I_{RESET}$ in a selected source line. This circuit combines features shown in circuits in FIG. 9B and FIG. 9B. A current source 902 limited to set current $I_{SET}$ is connected to the upper left arm transistor 820 of the H bridge 806. A current source 602 limited to reset current $I_{RESET}$ is connected to the upper right arm transistor 826 of the H bridge 806. Operation of the transistors 820, 822, 824, 826 of the H bridge 806 is similar to that depicted in FIG. 8. Controlled, limited set current $I_{SET}$ is switched to the selected bitline 412 during an RRAM cell set operation, while the source line is grounded. Controlled, limited reset current $I_{RESET}$ is switched to the selected source line 414 during an RRAM cell reset operation, while the bitline is grounded.

Figure 10:
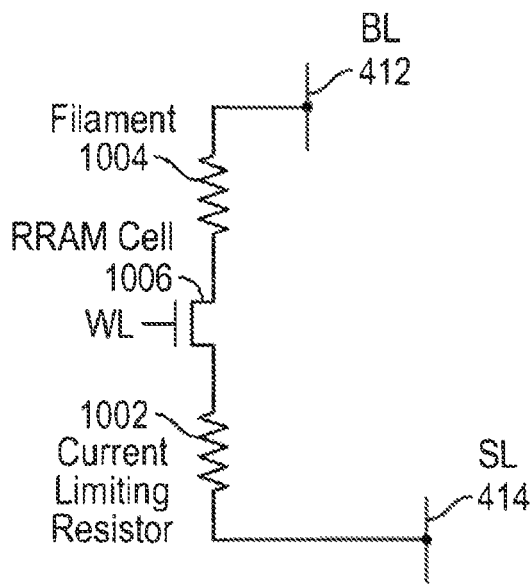
FIG. 10 illustrates a current limiting resistor in an RRAM cell, according to an embodiment.

FIG. 10 illustrates a current limiting resistor 1002 in an RRAM cell, according to an embodiment. In this embodiment, current in both directions through the resistor or resistive filament 1004 of the RRAM cell is limited, although not separately controllable for set and reset operations. In the embodiment shown, the resistor or resistive filament 1004 of the RRAM cell is on the bitline side of the access transistor 1006, and the current limiting resistor 1002 is on the source line side of the access transistor 1006. The current limiting resistor 1002 is depicted on the opposite side of the access transistor 1006 of the RRAM cell as the resistor or resistive filament 1004, but could be on the same side, or swapped with the resistor or resistive filament 1004, in further embodiments.

Figure 11:
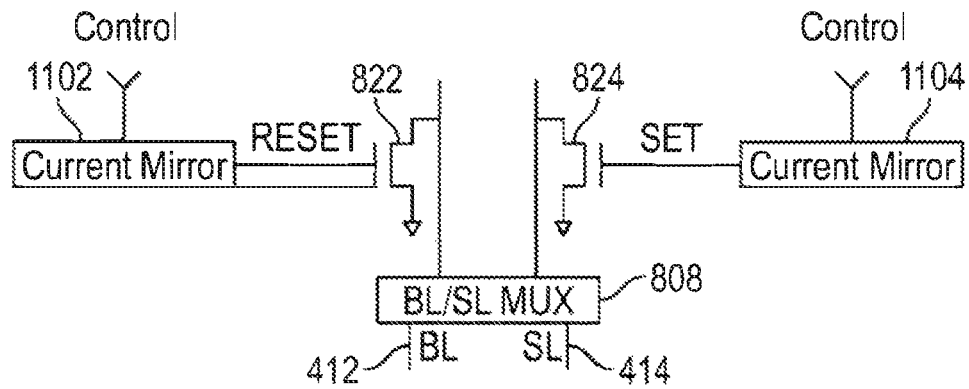
FIG. 11 illustrates an embodiment of a circuit with controlled current mirrors coupled to pull down transistors for limiting current in a selected bitline and a selected source line.

FIG. 11 illustrates an embodiment of a circuit with controlled current mirrors 1102, 1104 coupled to pull down transistors 822, 824 for limiting current in a selected bitline 412 and a selected source line 414. For a set operation, the left-side controlled current mirror 1102 is activated through the control, turning on the reset signal to a gate voltage for the pulldown transistor 822 that causes mirrored current through the pulldown transistor 822 and the selected bitline 412, through the bitline/source line multiplexer 808. This circuit could implement a variation of the circuit shown in FIG. 7. For a reset operation, the right-side controlled current mirror 1104 is activated through the control, turning on the set signal to a gate voltage for the pulldown transistor 824 that causes mirrored current through the pulldown transistor 824 and the selected source line 414, through the bitline/source line multiplexer 808.

Figure 12:
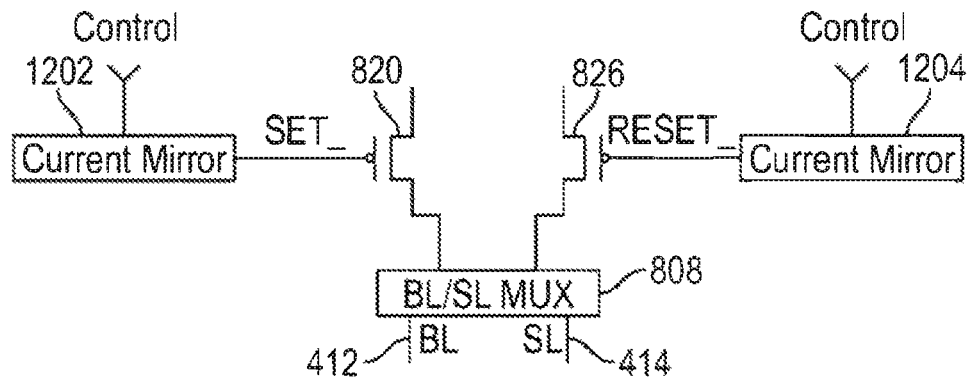
FIG. 12 illustrates an embodiment of a circuit with controlled current mirrors coupled to pull up transistors for limiting current in a selected bitline and a selected source line.

FIG. 12 illustrates an embodiment of a circuit with controlled current mirrors 1202, 1204 coupled to pull up transistors 820, 826 for limiting current in a selected bitline 412 and a selected source line 414. For a set operation, the left-side controlled current mirror is activated through the control, turning on the set signal (active low) to a gate voltage for the pull-up transistor 820 that causes mirrored current through the pull-up transistor 820 and the selected bitline 412, through the bitline/source line multiplexer 808. For a reset operation, the right-side controlled current mirror 1204 is activated through the control, turning on the reset signal (active low) to a gate voltage for the pull-up transistor 824 that causes mirrored current through the pull-up transistor 824 and the selected source line 414, through the bitline/source line multiplexer 808.

Figure 13:
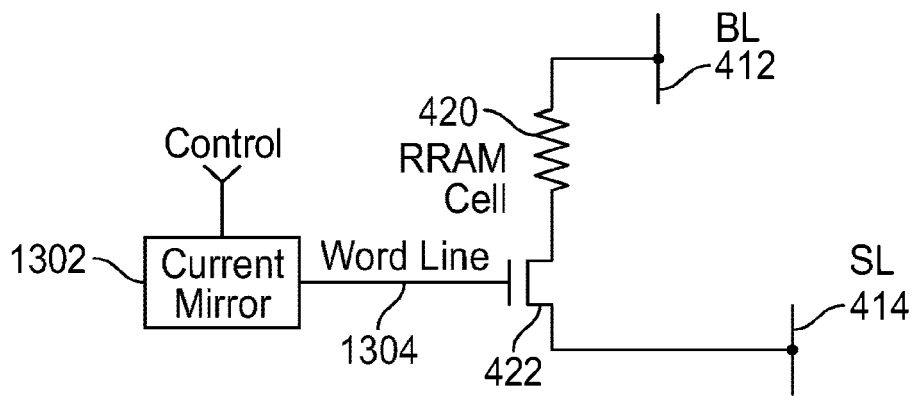
FIG. 13 illustrates a controlled current mirror coupled to a word line for limiting current in a selected RRAM cell, according to an embodiment.

FIG. 13 illustrates a controlled current mirror 1302 coupled to a word line 1304 for limiting current in a selected RRAM cell, according to an embodiment. One version puts a current mirroring gate voltage on the word line 1304 to an access transistor 422 during a set operation in which the source line 414 is grounded and the bitline 412 is coupled to a set voltage. This limits the current through the resistor 420 of the RRAM cell during a set operation. Another version puts a current mirroring gate voltage on the word line 1304 to the access transistor 422 during a reset operation in which the bitline 412 is grounded and the source line 414 is coupled to a reset voltage. This limits the current through the resistor 420 of the RRAM cell during a reset operation.

Figure 14A:
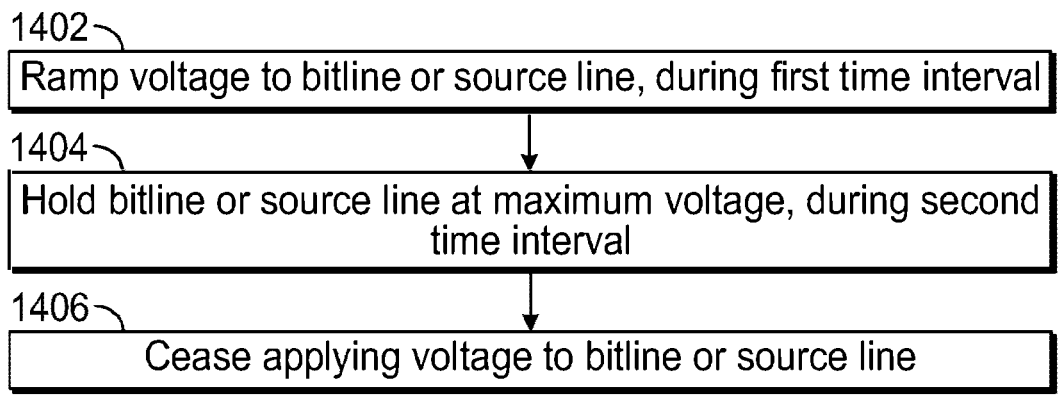
FIG. 14A is a flow diagram of a method for operating an RRAM array, according to an embodiment, which can be practiced by embodiments disclosed herein.

FIG. 14A is a flow diagram of a method for operating an RRAM array, which can be practiced by embodiments disclosed herein. In an action 1402, voltage to a bitline or source line is ramped during a first time interval. An example of a ramped bitline voltage is shown in the lower part of FIG. 2. An RRAM array generally has multiple bitlines and multiple source lines, a selector activates one of each for a given memory address. An RRAM circuit could use current control, current limiting, or voltage control to produce a ramped pulse waveform.

In an action 1404, the bitline or source line is held at a maximum voltage, during a second time interval. For example, the maximum voltage could be a set voltage or a reset voltage, depending on whether a set operation or a reset operation is being performed on a selected RRAM cell.

In an action 1406, the voltage to the bitline or source line ceases being applied. Actions 1402 through 1406 create a ramped voltage with a hold time at a maximum voltage, on a bitline or source line for an RRAM array. The ramped voltage more gradually applies current, voltage and power to a selected RRAM cell, as compared to a pulsed waveform without a ramp, decreasing surge. This may decrease or eliminate damage to the resistive filament in the RRAM cell over time, or result in more uniform distribution of resistivity or a narrower range of resistivity in RRAM cells for the array, increasing read reliability.

Figure 14B:
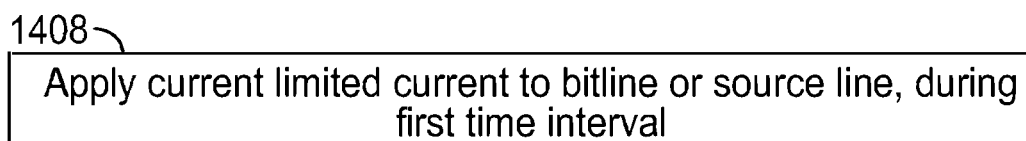
FIG. 14B is a flow diagram of an action for the method illustrated in FIG. 14A, according to an embodiment.

FIG. 14B is a flow diagram of an action for the method illustrated in FIG. 14A. In an action 1408, a current limited current is applied to the bitline or source line, during the first time interval. As a result of having parasitic capacitance on the bitline or source line, the current limited current application to the bitline or source line produces a ramped voltage.

Figure 14C:
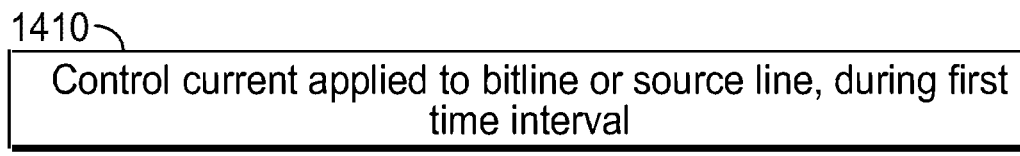
FIG. 14C is a flow diagram of an action for the method illustrated in FIG. 14A, according to an embodiment.

FIG. 14C is a flow diagram of an action for the method illustrated in FIG. 14A. In an action 1410, a current applied to the bitline or source line is controlled during the first time interval. As a result of having parasitic capacitance on the bitline or source line, the application of controlled current to the bitline or source line produces a ramped voltage.

Figure 14D:
FIG. 14D is a flow diagram of an action for the method illustrated in FIG. 14A, according to an embodiment.

FIG. 14D is a flow diagram of an action for the method illustrated in FIG. 14A. In an action 1412, a current limit of current applied to the bitline or source line is adjusted. Adjustment could occur during manufacturing, for example by laser trimming a reference resistor or reference transistor. Adjustment could occur during runtime for a circuit, for example by analog feedback to a control circuit, or updating of a parameter in a digital circuit, or combination of these for mixed analog and digital, etc.

With reference to FIGS. 14A-14D, in a further embodiment a different current limit is applied to the second interval to limit the maximum current through the RRAM cell when the RRAM cell changes to the low resistance state. During the first time interval, the current controls the ramp rate, during the second time interval the current control limits the current through the RRAM cell, and these are set independently. Other current limiting techniques may be used in conjunction with the ramped bitline. For example, current through the RRAM cell can be controlled by the current mirroring scheme using a word line as depicted in FIG. 13, in combination with a ramped bitline pulse. In some versions, it would not be necessary to further limit current through the bitline during the second time interval, as the current through the RRAM cell would be limited through the word line access transistor.

With reference to FIGS. 1-14, various circuits are described functionally and structurally in the embodiments using MOSFET technology, and actions of a method are described with reference to circuit and apparatus embodiments. It should be appreciated that further circuit embodiments with other types of MOSFETs, other types of FETs, and other types of transistors are readily devised in keeping with the teachings herein. Specifically, various circuits for current mirrors, current mirror control, current limit adjustment, switching, multiplexing, demultiplexing, pulse generation, voltage control, timing and other functionalities described herein are readily developed for variations and further embodiments. One or more features from one or more embodiments described herein are readily combined with one or more features from one or more further embodiments described herein. Embodiments with subsets of features are readily developed.

The above description of illustrated embodiments of the disclosure, including what is described in the Abstract, is not intended to be exhaustive or to limit the disclosure to the precise forms disclosed. While specific embodiments of, and examples for, the disclosure are described herein for illustrative purposes, various equivalent modifications are possible within the scope of the disclosure, as those skilled in the relevant art will recognize. Other embodiments may have layers in different orders, additional layers or fewer layers than the illustrated embodiments.

Various operations are described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "above" "under," "between," and "on" as used herein refer to a relative position of one material layer or component with respect to other layers or components. For example, one layer deposited above or over or under another layer may be directly in contact with the other layer or may have one or more intervening layers. Moreover, one layer deposited between two layers may be directly in contact with the two layers or may have one or more intervening layers. In contrast, a first layer "on" a second layer is in direct contact with that second layer. Similarly, unless explicitly stated otherwise, one feature deposited between two features may be in direct contact with the adjacent features or may have one or more intervening layers.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such. The terms "first," "second," "third," "fourth," etc. as used herein are meant as labels to distinguish among different elements and may not necessarily have an ordinal meaning according to their numerical designation.

The invention claimed is:

1. A method, comprising:
ramping a voltage applied to a bitline or a source line that is coupled to a resistive random access memory (RRAM) cell, from a minimum voltage value to a maximum voltage value during a first time interval, wherein the voltage is for setting or resetting the RRAM cell during a set or rest operation;
holding the voltage at the maximum voltage value during a second time interval after the first time interval;
ceasing applying the voltage after the second time interval; and
adjusting a first adjustable current limit of a current that is applied to the source line to be lower than a second adjustable current limit of a current that is applied to the bitline.

2. The method of claim 1, wherein the ramping the voltage comprises:
applying a current limited current to the bitline or the source line during the first time interval.

3. The method of claim 1, wherein the ramping the voltage comprises:
controlling a current applied to the bitline or the source line during the first time interval.

4. The method of claim 1, wherein the ramping the voltage comprises:
limiting a current to the bitline during a set operation for the RRAM cell, through a current limiter that further limits a current to the source line during a reset operation for the RRAM cell.

5. The method of claim 1, wherein:
the first time interval, for the ramping the voltage, is based on a current limit applied to the bitline or the source line, and parasitic capacitance of the bitline or the source line; and
the ramping the voltage and the holding the voltage are to adjust a resistance of a filament structure of the RRAM cell.

6. The method of claim 1, further comprising:
limiting the voltage applied to the bitline or the source line during the second time interval of the set operation or the reset operation.

7. The method of claim 1, further comprising:
coupling a common supply to the bitline or the source line during the set operation or the reset operation.

8. The method of claim 1, further comprising:
coupling a current mirror to a word line that is coupled to the RRAM cell during the reset operation.

9. The method of claim 1, further comprising:
coupling a current mirror to a word line that is coupled to the RRAM cell during the set operation.

10. The method of claim 7, further comprising:
coupling the common supply to the bitline during the set operation.

11. The method of claim 7, further comprising:
coupling the common supply to the source line during the reset operation.

12. The method of claim 1, further comprising:
limiting the current to the bitline during the set operation; and
limiting the current to the source line during the reset operation.

13. The method of claim 1, further comprising:
coupling a set voltage source to the bit line; and
coupling a current source limited to a reset current to the source line.

14. The method of claim 1, further comprising:
coupling a current source limited to a set current to the bit line; and
coupling a reset voltage source to the source line.

15. The method of claim 1, further comprising:
coupling a current source limited to a set current to the bit line; and
coupling a current source limited to a reset current to the source line.

16. The method of claim 1, further comprising:
applying a controlled current source, from a maximum reset voltage, to the source line, and grounding the bit line, during a reset operation.

17. The method of claim 1, further comprising:
applying a reset voltage to the source line, and applying a controlled current source to the bitline, during a reset operation.

* * * * *